United States Patent [19]

Fey

[11] Patent Number: 4,746,820
[45] Date of Patent: May 24, 1988

[54] PULSE FREQUENCY RESPONSIVE SWITCH

[75] Inventor: Rainer Fey, Schweinfurt, Fed. Rep. of Germany

[73] Assignee: Fichtel & Sachs AG

[21] Appl. No.: 12,293

[22] Filed: Feb. 9, 1987

[30] Foreign Application Priority Data

Mar. 29, 1986 [DE] Fed. Rep. of Germany ....... 3610605

[51] Int. Cl.$^4$ .......................... H03K 9/06; H03K 5/13
[52] U.S. Cl. .................................... 307/524; 307/592; 307/247.1; 328/138
[58] Field of Search ........... 307/592, 524, 522, 247 R, 307/239; 328/138

[56] References Cited

U.S. PATENT DOCUMENTS

| | | | |
|---|---|---|---|
| 3,852,675 | 12/1974 | Stewart | 328/138 |
| 3,943,382 | 3/1976 | Hermansdorfer et al. | 307/522 |
| 3,976,948 | 8/1976 | Dearden et al. | 328/138 |
| 4,454,434 | 6/1984 | Walker | 307/523 |

FOREIGN PATENT DOCUMENTS

| | | |
|---|---|---|
| 978045 | 12/1964 | United Kingdom . |
| 1182027 | 2/1970 | United Kingdom . |
| 1196551 | 7/1970 | United Kingdom . |
| 1416921 | 12/1975 | United Kingdom . |
| 1452757 | 10/1976 | United Kingdom . |
| 1483795 | 8/1977 | United Kingdom . |

Primary Examiner—Stanley D. Miller
Assistant Examiner—Richard Roseen
Attorney, Agent, or Firm—Toren, McGeady & Associates

[57] ABSTRACT

A pulse frequency responsive switch includes a monoflop for receiving a pulse sequence. In response thereto, the monoflop generates a resulting square wave signal for application to an integration circuit and then a comparator. When the pulse rate of the pulse sequence exceeds the reciprocal of the relaxation time of the monoflop, the output therefrom assumes a steady D.C. voltage, which causes the comparator to generate an output signal for the pulse frequency responsive switch. This output signal is also used to lower the relaxation time of the monoflop, giving a hysteresis property to the pulse frequency responsive switch.

5 Claims, 1 Drawing Sheet

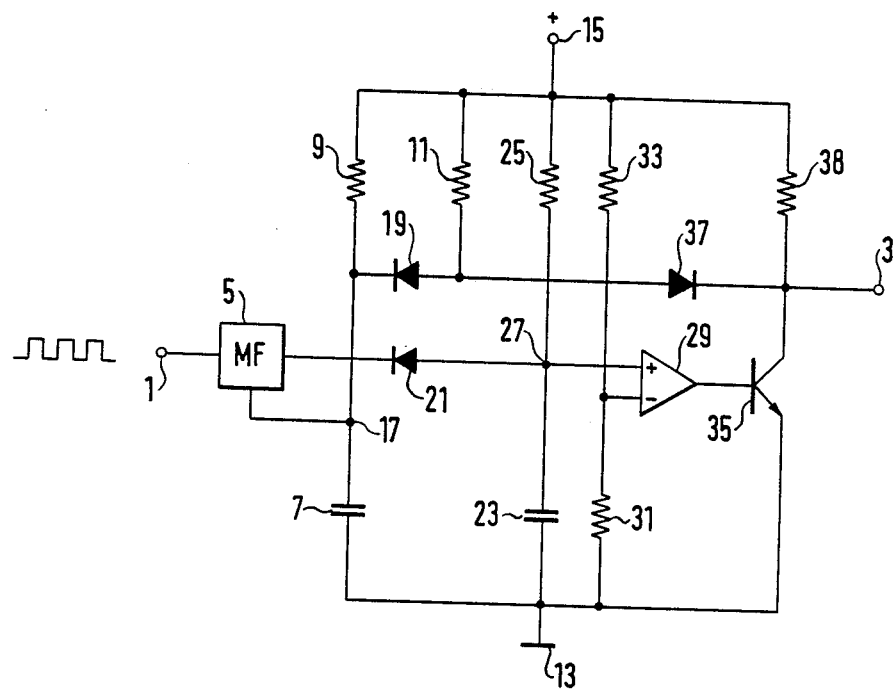

PULSE FREQUENCY RESPONSIVE SWITCH

BACKGROUND OF THE INVENTION

The invention relates to a switch which is controllable in dependence upon the rate of a pulse sequence.

In several utilization cases, especially in the motor vehicle sector, a switch is necessary which is switched in dependence upon the rate of a pulse sequence. By means of such a pulse frequency responsive switch, for example in a motorcycle, the ignition can be interrupted on reaching a predetermined driving speed, so that it would be possible to limit the engine rotation rate and thus the driving speed. In a motor vehicle, the frequency switch can control the speed-dependent extension and retraction of a spoiler.

The invention is directed towards provision of a switch suitable especially for use in a motor vehicle, which is controllable with comparatively low constructive expense in trouble-free manner in dependence upon the rate of a pulse sequence.

SUMMARY OF THE INVENTION

In accordance with the invention, to the output of a monoflop retriggerable by edges of pulses in the pulse sequence, there is connected an integration circuit, and the integration signal of which controls a threshold-value circuit. The integration time constant of the integration circuit is greater than the relaxation time of the monoflop.

The retriggerable pulse edge-controlled monoflop delivers square-wave pulses at its output having pulse widths determined by the relaxation time of the monoflop. If the pulse rate of the pulse sequence which retriggers the monoflop becomes greater than the reciprocal of the pulse width, then the monoflop can no longer resolve the input pulses, and instead of a square-wave voltage it delivers a direct-current voltage. The integration circuit detects the occurrence of the direct-current voltage, since its integration time constant is greater than the relaxation time of the monoflop. As long as square-wave pulses occur at the output of the monoflop, the integration circuit will discharge, at least partially, in the pulse intervals, and the threshold-value circuit cannot respond. If on exceeding the response frequency of the pulse frequency responsive switch, the monoflop delivers a direct-current voltage, then the integration signal of the integration circuit rises to a value which causes the threshold-value circuit to respond. Especially if the integration time constant amounts to a multiple of the relaxation time of the monoflop, interference signals are reliably suppressed.

In a preferred embodiment, the integration circuit comprises a capacitor which is connected through a resistor to a voltage source. The output of the monoflop is expediently connected, by way of a diode, to the connection point of the capacitor and the resistor. The threshold-value circuit comprises a comparator which compares the voltage at the connection point with a reference voltage. While the resistor limits the charge current of the capacitor, the diode permits a comparatively fast discharge of the capacitor in the pulse intervals of the output signal of the monoflop.

The frequency pulse frequency responsive switch preferably has a hysteresis behavior, that is it switches at a higher value with a rising pulse rate than with a falling pulse rate. The stability of the pulse frequency responsive switch is improved by the switching hysteresis. The switching hysteresis can be achieved in a simple manner in that, for the establishment of the relaxation time, a capacitor-resistor network is conneced to the monoflop and comprises several resistors of which at least one is connected through a controllable switch with the network, the controllable switch being controlled by the threshold-value circuit. In dependence upon the output signal of the threshold-value circuit, the relaxation time of the monoflop is varied. Below the frequency threshold at which the frequency switch, should switch with rising frequency, the monoflop has a shorter relaxation time than above the frequency threshold for switching back with falling frequency. The controlling of the capacitor-resistor network expediently takes place through a diode switch.

The various features of novelty which characterize the invention are pointed out with particularity in the claims annexed to and forming a part of this disclosure. For a better understanding of the invention, its operating advantages and specific objects attained by its use, reference should be had to the accompaying drawing and descriptive matter in which there is illustrated and described a preferred embodiment of the invention.

BRIEF DESCRIPTION OF THE DRAWING

The drawing shows a circuit diagram of a pulse frequency responsive switch controllable in dependence upon the rate of a pulse sequence.

DETAIL DESCRIPTION OF THE INVENTION

The pulse frequency responsive switch, as represented in the Figure, responds to the pulse rate of a pulse signal fed to its input 1 and delivers a "0" level signal at its output 3, which is normally situated at a "1" level, when the pulse rate of the input signal exceeds a pre-determined value. The input pulse signal can be a signal proportional to the driving speed, for example from a tachometer or the like, of a vehicle, and the pulse frequency responsive switch can be used to trigger driving-speed-dependent actions. By way of example, the pulse frequency responsive switch can be utilized to switch off and ignition and thus to limit the rotation rate of an engine or to limit the driving speed of a motorocycle or for retracting and extending a spoiler on a motor vehicle in dependence upon driving speed.

The pulse frequency responsive switch comprises a pulse edge-control lable, retriggerable monoflop 5, the relaxation time of which is fixed by a capacitor-resistor network, consisting of a capacitor 7 and two resistors 9, 11. The resistor 9 and the capacitor 7 are connected in series with one another between ground 13 and a positive supply voltage terminal 15, the frequency control input of the monoflop 5 being connected to the connection point 17 between the capacitor 7 and the resistor 9. The resistor 11 is connected in series with a diode 19 parallel to the resistor 9 between the supply voltage terminal 15 and the connection point 17. The diode 19 is polarized in the forward direction for the supply voltage.

An integration circuit, consisting of a capacitor 23 connected to ground 13 and a charging resistor 25 connecting the terminal of the capacitor 23 remote from ground with the supply voltage terminal 15, is connected to the output of the monoflop 5 through a decoupling diode 21. The diode 21 is connected with the connection point 27 between the capacitor 23 and the charging resistor 25 and is polarized so that it decouples the output of the monoflop 5 from the connection point 27 when the output of the monoflop 5 has the "1" level, and short-circuits the capacitor 23 when the output of the monoflop 5 is conducting the "0" level.

To the connection point 27, there is connected the non-inverting input of a comparator 29, the inverting input of which being connected to a reference voltage source which is formed by a voltage-divider circuit arrangement of two resistors 31, 33 connected between ground 13 and the supply voltage terminal 15. The base of a switching transistor 35, the emitter of which is connected with ground 13 and the collector of which delivers the signal of the output 3, is connected to the output of the comparator 29. The collector of the transistor 35 is further connected, through a diode 37 polarized in the forward direction for the supply voltage, with the connection point of the resistor 11 and the diode 19. The diodes 19, 37 are polarized in the same direction in relation to the connection point. The diodes 19, 37, together with the transistor 35, form a switch which, in dependence upon the output level of the comparator 29, connects the resistor 11 with or disconnects it from the connection point 17.

The pulse frequency responsive switch works as follows:

For the following explanation let it be assumed that the resistor 11 is disconnected from the resistor 9. Thus the relaxation time of the monoflop 5 is determined exclusively by the capacitance C7 of the capacitor 7 and the resistance value R9 of the resistor 9. The relaxation time T1 amounts to R9×C7. As long as the rate of the pulse sequence fed to the input 1 is less than the reciprocal of the relaxation time T1, that is, the pulse width of the pulses delivered by the monoflop 5, square-wave pulses likewise appear at the output of the monoflop 5. If the pulse rate is greater than the reciprocal of the pulse width, then a direct-current voltage at the "1" level appears at the output of the monoflop 5. Thus, in dependence upon the circuit arrangement which determines the pulse width, the monoflop 5 delivers a pulse signal or a direct-current voltage signal, depending on whether the pulse rate of its input signal is smaller or greater than a pre-determined value.

In combination with the integration circuit of the capacitor 23 and the resistor 25, the comparator 29 converts the square-wave signal generated by the monoflop 5 for the lower-pulse frequency responsive switch condition of the frequency switch likewise into a direct-current voltage signal, whereby a two-level direct-current voltage signal is delivered at the output 3. The integration time constant T2 of the integration circuit is equal to the product of the capacitance C23 of the capacitor 23 and the value R25 of the resistor 25 and amounts to a multiple of the relaxation time T1, that is the pulse width of the monoflop 5. As long as the output level of the monoflop 5 has "1" level, the capacitor 23 is charged through the resistor 25 and the voltage at the connection point 27 rises. In the case of "0" level at the output of the monoflop 5 the capacitor 23 is discharged. Thus the voltage on the connection point 27 follows the output pulses of the monoflop 5. The reference voltage on the inverting input of the comparator 29 is set so that the switching point of the comparator 29 is not exceeded as long as the monoflop 5 has a pulse output signal. The potential on the connection point 27 can exceed the reference voltage level of the comparator 29 only when the monoflop 5, after reaching its frequency threshold, delivers a direct-current voltage signal. Thus the output signal of the comparator 29 is a two-level direct-current voltage signal which controls the transistor 35 and thus the output 3.

The resistors 9, 11 render possible a switching hysteresis of the pulse frequency responsive switch. Below the frequency threshold of the pulse frequency responsive switch, the comparator 29 conducts a "0" level on its output, whereby the transistor 35 has at its collector, through a charging resistor 38, a "1" potential or the potential of the supply voltage terminal 15. Thus, the diode 19 is biased in the blocking direction and the resistor 11 is connected in parallel with the resistor 9, through the diode 19 polarized in the forward direction, for the charging current of the capacitor 7 flowing from the supply voltage terminal 15 to ground 13. Thus, the relaxation time T1 of the monoflop 5 is determined by the parallel connection of the resistor 9 and 11.

Above the frequency threshold, the output of the comparator 29 conducts the "1" potential and the transistor 35 is switched to transmissive. The collector of the transistor 35 is situated nearly at ground potential, whereby the diode 37 is biased in the forward direction and draws the diode 19 in the blocking direction to ground potential. Thus the resistor 11 is uncoupled from the connection point 17 and the relaxation time T1 of the monoflop 5 is now determined only by the resistor 9. The relaxation time of the monoflop 5 is thus greater, above the frequency threshold of the pulse frequency responsive switch, than below the pulse frequency responsive threshold, which corresponds to a switching hysteresis of the pulse frequency responsive switch.

While specific embodiments of the invention have been shown and described in detail to illustrate the application of the inventive principles, it will be understood that the invention may be embodied otherwise without departing from such principles.

What I claim is:

1. A switch controllable as a function of a pulse rate of a sequence of pulses, comprising:
   (a) a monoflop triggerable by an edge in each of the pulses in said pulse sequence;
   (b) a capacitor-resistor network coupled to a control input of said monoflop for determining a triggering time of said monoflop, said network including a controllable switch for changing the resistance therein, whereby a first switching position sets a first triggering time in said monoflop and a second switching position sets a second triggering time which is shorter than said first triggering time;
   (c) an integration circuit connected to an output of said monoflop for integrating the output therefrom; and
   (d) a comparator connected to an output of said integration circuit for comparing the integrated output to a reference voltage, an output of said comparator being connected to a control input of said controllable switch in said network, whereby, when the integrated output is lower than said reference voltage, said controllable switch is set in the first switching position, and when the integrated output is higher than said reference voltage, said controllable switch is set in the second switching position.

2. A switch according to claim 1, wherein an integration time constant of said integration circuit is a multiple of one of said first and second triggering times.

3. A switch according to claim 1, wherein the integration circuit comprises a capacitor which is connected through a resistor to a voltage source, wherein an output of the monoflop is connected through a diode to a connection point of the capacitor and the resistor.

4. A switch according to claim 1, wherein the capacitor-resistor network comprises two resistors, of which a first resistor together with a capacitor forms an RC member determining the second triggering time of said monoflop, and a second resistor is connected in parallel with the first resistor through a series diode acting as said controllable switch for determining the first triggering time, wherein said comparator is connected through a control diode to a connection point of the series diode and the second resistor thereby controlling said series diode.

5. A switch according to claim 4, wherein the comparator controls a switching transistor, the collector-emitter path of which lies in series with the cotrol diode.

* * * * *